(12) United States Patent
Hirler

(10) Patent No.: US 8,946,817 B2
(45) Date of Patent: Feb. 3, 2015

(54) SEMICONDUCTOR DEVICE WITH COMPENSATION REGIONS

(71) Applicant: Infineon Technologies Austria AG, Villach (AT)

(72) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 30 days.

(21) Appl. No.: 13/862,835

(22) Filed: Apr. 15, 2013

(65) Prior Publication Data
US 2014/0306298 A1     Oct. 16, 2014

(51) Int. Cl.
*H01L 29/66* (2006.01)
*H01L 29/06* (2006.01)
*H01L 29/10* (2006.01)
*H01L 29/36* (2006.01)
*H01L 29/78* (2006.01)

(52) U.S. Cl.
CPC ........ *H01L 29/0684* (2013.01); *H01L 29/1079* (2013.01); *H01L 29/36* (2013.01); *H01L 29/78* (2013.01)
USPC .............................. 257/339; 257/409; 257/487

(58) Field of Classification Search
USPC ........................................ 257/339, 409, 487
See application file for complete search history.

(56) References Cited

U.S. PATENT DOCUMENTS 4,998,149 A * 3/1991 Tadano et al. ................. 257/268

\* cited by examiner

*Primary Examiner* — Mark Prenty
(74) *Attorney, Agent, or Firm* — Murphy, Bilak and Homiller, PLLC

(57) ABSTRACT

A semiconductor device includes a semiconductor body including an inner region, and an edge region, a first doped device region of a first doping type in the inner region and the edge region and coupled to a first terminal, and at least one second doped device region of a second doping type complementary to the first doping type in the inner region and coupled to a second terminal. Further, the semiconductor device includes a minority carrier converter structure in the edge region. The minority carrier converter structure includes a first trap region of the second doping type adjoining the first doped device region, and a conductor electrically coupling the first trap region to the first doped device region.

21 Claims, 5 Drawing Sheets

US 8,946,817 B2

SEMICONDUCTOR DEVICE WITH COMPENSATION REGIONS

TECHNICAL FIELD

Embodiments of the present invention relate to a semiconductor device with an edge termination, in particular a vertical power semiconductor device.

BACKGROUND

Power semiconductor devices, such as power diodes, or power MOSFETs, are designed to withstand high blocking voltages. Those power devices include a pn-junction that is formed between a p-doped semiconductor region and an n-doped semiconductor region. The component blocks (is switched off) when the pn-junction is reverse biased. In this case a depletion region (also referred to as space charge region) propagates in the p-doped and n-doped regions. Usually, one of these semiconductor regions is more lightly doped than the other one of these semiconductor regions, so that the depletion region mainly extends in the more lightly doped region, which mainly supports the voltage applied across the pn-junction. The semiconductor region supporting the blocking voltage is referred to as base region in a diode, and is referred to as drift region in a MOSFET.

The ability of a pn-junction to support high voltages is limited by the avalanche breakdown phenomenon. As a voltage applied across a pn-junction increases, an electric field in those semiconductor regions that form the pn-junction increases. The electric field results in an acceleration of mobile charge carriers that are present in the semiconductor region. An avalanche breakdown occurs when, due to the electric field, the charge carriers are accelerated such that they create electron-hole pairs by impact ionization. Charge carriers created by impact ionization create new charge carriers, so that there is a multiplication effect. At the onset of an avalanche breakdown, a significant current flows across the pn-junction in the reverse direction. The voltage at which the avalanche breakdown sets in is referred to as breakdown voltage.

The electric field at which the avalanche breakdown sets in is referred to as critical electric field ($E_{crit}$). The absolute value of the critical electric field is mainly dependent on the type of semiconductor material used for forming the pn-junction, and is weakly dependent on the doping concentration of the more lightly doped semiconductor region.

The critical electric field is a theoretical value that is defined for a semiconductor region that has an infinite size in directions perpendicular to field strength vectors of the electric field. Power semiconductor components, however, have semiconductor bodies of finite size that are terminated by edge surfaces in lateral directions. In vertical power semiconductor devices, which are semiconductor devices in which the pn-junction mainly extends in a horizontal plane of the semiconductor body, the pn-junction usually does not extend to the edge surface of the semiconductor body but is distant to the edge surface of the semiconductor body in a lateral direction. In this case, a semiconductor region (edge region) of the semiconductor body adjoining the pn junction in the lateral direction also has to withstand the blocking voltage.

In so-called superjunction devices, the pn-junction has a relatively large area. These devices include compensation regions doped complementary to the drift region and adjoining the drift region. pn-junctions between the compensation regions and the drift region form a part of the overall pn-junction of the semiconductor device. The compensation regions serve to compensate dopant carriers in the drift region when the pn-junction is reverse biased. This compensation effect allows the implementation of a drift region with a higher doping concentration than a conventional (non-superjunction) device, resulting in a lower on-resistance at a given voltage blocking capability.

When the pn-junction is forward biased, minority charge carriers emitted from the compensation regions into the drift region and majority charge carriers in the drift region form a charge-carrier plasma. When the pn-junction is reverse biased, this charge-carrier plasma has to be removed from the drift region before the semiconductor device blocks. A high quantity of charge carriers stored in the edge region when the pn-junction is forward biased may result in a reduced voltage blocking capability of the edge region, and may result in a destruction of the semiconductor device.

SUMMARY

A first embodiment relates to a semiconductor device. The semiconductor device includes a semiconductor body including an inner region, and an edge region, a first doped device region of a first doping type in the inner region and the edge region and coupled to a first terminal, and at least one second doped device region of a second doping type complementary to the first doping type in the inner region and coupled to a second terminal. Further, the semiconductor device includes a minority carrier converter structure in the edge region. The minority carrier converter structure includes a first trap region of the second doping type adjoining the first device region, and a conductor electrically coupling the first trap region to the first device region

BRIEF DESCRIPTION OF THE DRAWINGS

Examples will now be explained with reference to the drawings. The drawings serve to illustrate the basic operation, so that only aspects necessary for understanding the basic principle are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
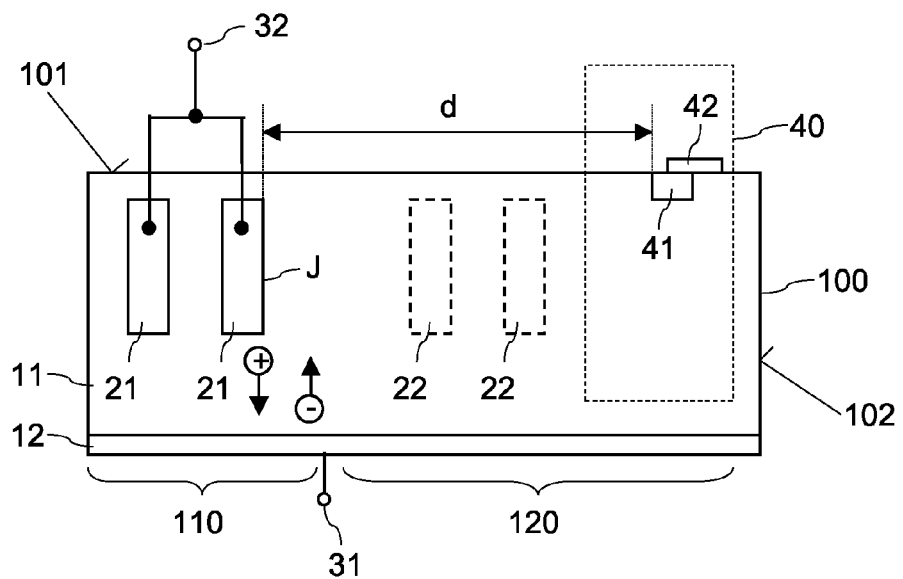
FIG. 1 schematically illustrates a vertical cross sectional view of a semiconductor device including a minority charge carrier converter in an edge region of a semiconductor body.

FIG. 1 illustrates a vertical cross sectional view of a semiconductor device according to one embodiment. The semiconductor device includes a semiconductor body 100 having a first surface 101, an inner region 110 and an edge region 120. FIG. 1 illustrates the semiconductor device in a vertical section plane, which is a section plane perpendicular to the first surface 101. The semiconductor body includes a conventional semiconductor material, such as, for example, silicon (Si), silicon carbide (SiC), gallium nitride (GaN), gallium arsenide (GaAs), or the like.

Referring to FIG. 1, a first doped device region 11 of a first doping type is arranged in the inner region 110 and the edge region 120. At least one second doped device region 21 forms a pn junction J with the first device region 11 in the inner region 110.

The first device region 11 is electrically coupled or connected to a first electrode or terminal 31, and the second device region 21 is electrically coupled to a second electrode or terminal 32. The first device region 11 will also be referred to as drift region or base region in the following, and the second device 21 region will also be referred to as a compensation region. According to one embodiment, there are a plurality of compensation regions 21 located in the inner region 110.

The semiconductor device further includes a minority carrier converter structure 40 in the edge region. This minority carrier converter structure 40 is explained in further detail herein below.

The inner region 110 in which the device junction J is located can also be referred to as active region of the semiconductor device. The edge region 120 adjoins the inner region or active region 110 in lateral directions of the semiconductor body 100 and surrounds the inner region 110. "Lateral directions" of the semiconductor body 100 are directions parallel to the first surface 101 of the semiconductor body 100. Since the edge region 120 surrounds the active region 110, the edge region 120 is always located between the active region 110 and an edge surface 102 of the semiconductor body 100. The "edge surface 102" is a surface of the semiconductor body 100 that terminates the semiconductor body 100 in the lateral directions. Referring to FIG. 1, the edge region 120 may adjoin the edge surface 102. However, the edge region 120 not necessarily adjoins the edge surface 102. According to a further embodiment (not illustrated) the edge region 120 could also be located between the inner region 110 and active regions of further semiconductor devices (not illustrated) implemented in the semiconductor body 100. Thus, the edge region 120 and the edge termination structure 40 implemented in the edge region 120 "terminate" the semiconductor device with the active region 110 but not necessarily terminate the semiconductor body 100 in which additional semiconductor devices may be implemented. In other words, in one semiconductor body 100 two or more semiconductor devices may be integrated monolithically where each of these semiconductor devices has its own termination system. It goes without saying that these termination systems of the single semiconductor devices may differ from each other depending on the demands, especially the desired voltage blocking capability, of each integrated semiconductor device.

In the embodiment shown in FIG. 1, the first region 11 is coupled to the first terminal 31 via a third region 12 that has the same doping type as the first region 11, but a higher doping concentration. The doping concentration of the first region 11 is, for example, between $1E12$ $cm^{-3}$ and $1E16$ $cm^{-3}$, the doping concentration of the second region 21 is, for example between $1E12$ $cm^{-3}$ and $1E16$ $cm^{-3}$, and the doping concentration of the third region 12 is, for example between $1E18$ $cm^{-3}$ and $1E21$ $cm^{-3}$ According to one embodiment, the overall number of dopant atoms in the first region 11 substantially corresponds to the overall number of dopant atoms in the at least one second region 21.

According to one embodiment, the third region 12 is formed by a doped semiconductor substrate having the desired doping concentration of the third region. In this embodiment, the first region 11 and the second region 21 can be arranged in an epitaxial layer formed on the substrate. The epitaxial layer may be formed with a doping concentration corresponding to the desired doping concentration of the first region 11, and the second region 21 (and other regions formed in the first region 11) can be produced by at least one of an implantation and a diffusion process. However, it is also possible to produce the first region 11 second region 21 during an epitaxial growth process that forms the epitaxial layer.

According to a further embodiment, the semiconductor body 100 includes a semiconductor substrate having the doping concentration of the first region 11. In this substrate, the second region 21 and third region 12 (and other regions formed in the first region 11) can be produced by at least one of an implantation and a diffusion process.

Referring to FIG. 1, the edge region 120 optionally includes at least one further device region 22 of the second doping type. This at least one further device region 22 will be referred to as a compensation region in the following. However, this compensation region 22 in the edge region 120, unlike the at least one compensation region 21 in the inner region 110, may be floating. That is, the at least one compensation region 22 in the edge region 120 may not be electrically connected to one of the terminals, such as the second terminal 32.

The semiconductor device may include further device features, such as, for example, a body region, a source region, a drain region, and a gate electrode when the semiconductor device is implemented as an MOS transistor. However, in FIG. 1, as well as in FIGS. 2 to 7, only those features of the semiconductor device are illustrated that are necessary to understand one way of operation of the edge termination structure 40 when the junction J is forward biased. This edge termination structure 40 can be employed in any semiconductor device that includes a drift region, such as the drift region 11 illustrated in FIG. 1, and a junction, such as the junction J between the drift region 11 and the compensation region 21 illustrated in FIG. 1. Semiconductor devices having a drift region and a junction between a drift region and a compensation region include, for example, MOS transistors, such as MOSFETs (Metal Oxide Gate Field-Effect Transistors), IGBTs (Insulated Gate Bipolar Transistors), or p-i-n diodes. In an IGBT, the third region 12 is doped complementary to the first region 11.

One way of operation of the semiconductor device depicted in FIG. 1 and, in particular, one way of operation of the edge termination structure 40 is explained in the following. The semiconductor device of FIG. 1 can assume two different operation states, namely a first operation state in which the pn junction J is forward biased, and a second operation state in which the pn junction J is reverse biased. Whether the pn junction J is forward biased or reverse biased is dependent on a voltage applied between the first and second terminals 31, 32. Just for explanation purposes, it is assumed that the first device region 11 is n-doped and that the second device region 21 is p-doped. In this case, the pn junction J is reverse biased when a positive voltage is applied between the first terminal 31 and the second terminal 32, and the pn junction J is forward biased when a negative voltage is applied between the first terminal 31 and the second terminal 32 (which corresponds to a positive voltage between the second terminal 32 and the first terminal 31). However, the way of operation explained below applies to a semiconductor device with a p-type first region 11 and an n-type second region 21 accordingly (with the difference that the polarities of the voltages have to be inverted as compared with a device having an n-type first region 11). When the pn junction J is reverse biased a depletion region (space charge region) expands in the first device region 11 and in the second device region 21 beginning at the pn junction J. As the voltage that reverse biases the pn junction J increases, the depletion region expands deeper into the first device region 11 and the second device region 21.

When the pn junction J is forward biased, the third region 12 emits first type charge carriers into the first region 11, and the at least one second device region 21 emits second type charge carriers into the first region 11. The first type charge carriers are n-type carriers (electrons) when the first region 11 and the third region 12 are n-doped, and the second type charge carriers are p-type carriers (holes) when the second device region 21 is p-doped. The voltage applied between the first and second terminals 31, 32 that causes the pn junction J to be forward biased results in a voltage difference between electrical potentials at the second region 21 and the third region 12. This voltage difference causes an electric field that, in turn, causes the n-type carriers to travel to the second region 21 and the p-type carriers to travel to the third region 12 so that a current flows between the first and second terminals 31, 32.

In an n-type first device region 11, the p-type charge carriers (holes) are minority charge carriers. When the semiconductor switches from a forward biased state to a reverse biased, these minority charge carriers have to be removed from the first device region 11 before the semiconductor device is capable to block. A portion of the p-type charge carriers emitted by the second device region 21 travel into the edge region 120 of the semiconductor device. However, in the edge region there is no electric field similar to the electric field between the second and third region 21, 12, so that in the edge region 120 p-type charge carriers are not forced into the third device region 12.

When a conventional semiconductor device that includes, in an inner region, first and second device regions as illustrated in FIG. 1, is reverse biased, p-type charge carriers have to be removed from the edge region. However, the removal of the p-type charge carriers from the edge region may cause a current from the edge region to the inner region of the semiconductor device, which may result in a destruction of the conventional semiconductor device. Referring to FIG. 1, the second regions 21 are connected to the second terminal 32, wherein the electrical connection is only schematically illustrated in FIG. 1. The current from the edge region results in a current to the second terminal 32. This current is mainly focused in those regions of the inner region 110 that are close to the edge region 120, and may result in a thermal overload in contact regions (not shown in FIG. 1) between the second regions 21 and the second terminal. Further, the current from the edge region 120 to the inner region 110 may cause multiplication of charge carriers and, therefore, an avalanche breakdown. Finally, charge carriers flowing from the edge region 120 to the inner region 110, in those regions where the charge carriers flow, have the same effect as an increased doping concentration and, therefore, may result in a reduced voltage blocking of the device in those regions.

It is therefore desirable to generally reduce the minority charge carrier concentration in the edge region 120 of the semiconductor device. The semiconductor device shown in FIG. 1 includes an edge structure 40 with a minority charge carrier trap that collects minority charge carriers in the edge region 120 and causes the minority charge carriers to recombine with majority charge carriers. Thereby, the minority carrier density is reduced close to zero in the vicinity of the edge structure 40 and is reduced in the whole edge region 120. The majority charge carriers flow substantially in a vertical direction of the semiconductor body 100 from the third region 12 to the minority charge carrier trap where they recombine with the minority charge carriers. Thus, a minority charge carrier flow into the charge carrier trap causes a corresponding majority charge carrier flow from the third region to the minority charge carrier trap. When the semiconductor device changes from the first operation state (when the pn junction J is forward biased) to the second operation state (when the pn junction J is reverse biased) a minority charge current flow in the lateral direction of the semiconductor device is reduced considerably.

Referring to FIG. 1, the minority charge carrier trap 40 includes a first trap region 41 of the second doping type. The doping concentration of the first trap region 41 is, for example, between 1E18 cm$^{-3}$ and 1E21 cm$^{-3}$. The first trap region 41 is electrically connected to the first region 11 through a conductor 42. In the embodiment of FIG. 1, the first trap region 41 is adjacent the first surface 101, and the conductor 42 is arranged on the first surface 101 and is electrically connected to the first trap region 41 and to a region of the first device region 11 adjoining the first surface 101. In the embodiment of FIG. 1, the first trap region 41 is located between the inner region 110 and a position where the conductor 42 contacts the first device region 11. The minority charge carrier trap 40 is spaced apart from to the inner region 110 in a lateral (horizontal) direction of the semiconductor body 100. According to one embodiment, a distance d between an outermost second device region 21 and the first trap region 41 is between 2 μm and several 100 μm. This distance is, for example, dependent on a desired voltage blocking capability of the semiconductor device and increases as the desired voltage blocking capability increases. For example, the distance d is about 2 μm when the voltage blocking capability is about 20V and can be up to several 100 μm when the voltage blocking capability is several 100V. The "outermost second region 21" is the second region 21 that is closest to the edge region 120.

According to a further embodiment (not illustrated), the conductor 42 is not located on top of the first surface 101 but is located in a trench extending from the first surface 101 into the semiconductor body 100.

Figure 2:
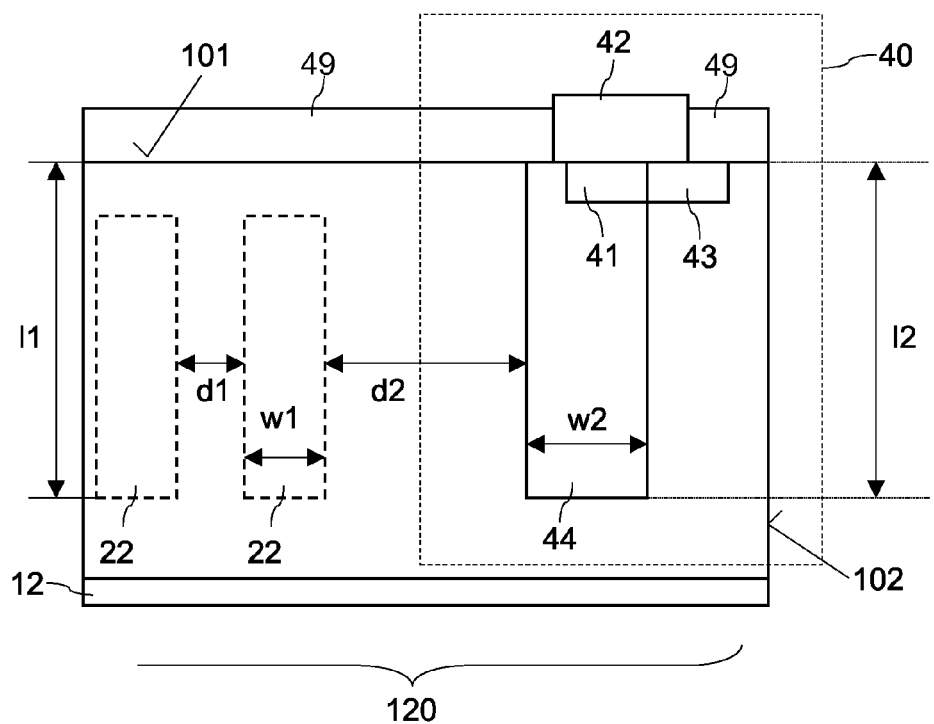
FIG. 2 illustrates a minority charge carrier converter according to one embodiment.

Referring to FIG. 2, which shows a vertical cross sectional view of only the edge region 120, the minority charge carrier trap 40 may additionally include a second trap region 44 of the second doping type and more lowly doped than the first trap region 41. The second trap region 44 adjoins the first trap region 41 and may extend deeper into the semiconductor body 100 from the first surface 101 than the first trap region 41. The conductor 42 may contact both, the first and the second trap region 41, 44. Further, the minority charge carrier trap 40 may include a contact region 43 of the first doping type, adjoining the first region 11, and more highly doped than the first region 11. The contact region 43 is electrically connected to the conductor 42. The contact region 43 may adjoin the first trap region 41 (as illustrated) or the second trap region 44 or may be spaced apart from the trap regions 41, 44. According to one embodiment, the doping concentration of the second trap region substantially corresponds to the doping concentration of the third region 12.

According to one embodiment, those areas of the first surface 101 in the edge region 120 that are not covered by the conductor 42 are covered by a passivation layer 49. The passivation layer 49 may include a conventional passivation material, such as an oxide, a nitride, and imide, or DLC (Diamond Like Carbon).

Referring to FIG. 2, the optional compensation region 22 in the edge region 120 and the second trap region 44 have a width w1 and w2, respectively, in a first lateral direction of the semiconductor body 100. The "first lateral direction" of the semiconductor body 100 is a direction from the inner region 110 towards the edge structure with the minority charge carrier trap. According to one embodiment, a first width w1 of the compensation region 22 is smaller than a second width w2 of the second trap region 44. According to one embodiment, the second width w2 is between 1.5 times and 3 times the first width w1, that is: $1.5 \cdot w1 \leq w2 \leq 3 \cdot w1$.

In one embodiment in which there are at least two compensation regions 22 in the edge region 120 two adjacent compensation regions 22 have a mutual first distance d1. Further, there is a second distance d2 between an outermost compensation region 22 and the second trap region 44. The "outermost compensation region 22" is the compensation region 22 closest to the second trap region 44. According to one embodiment, the first distance d1 is smaller than the second distance d2. According to one embodiment, the second distance d2 is larger than 1.5 times the first distance d1, that is: $d2 \geq 1.5 \cdot d1 \leq d2$.

In the embodiment shown in FIG. 2, lower ends of the compensation region 22 and the second trap region 44 are substantially at the same vertical position of the semiconductor body 100. "Lower ends" of the compensation region 22 and the second trap region 44 are those ends facing the third device region 12. However, implementing the semiconductor device such that the lower ends of the compensation region 22 and the second trap region 44 end at substantially the same vertical level is only an example. According to a further embodiment (not illustrated), a lower end of the second trap region 44 is closer to the first surface 101 than a lower end of the compensation region 22.

According to another embodiment, a lower end of the second trap region 44 is closer to 12 than a lower end of the compensation region 22. That is, the second trap region 44 extends farther to the third region 12 than the compensation region 22. According to yet another embodiment, the width w2 of the second trap region 44 increases towards the third region 12, so that the second trap region 44 has a smaller width w2 in regions close to the first surface 101 than in regions close to the third region 12.

Figure 3:
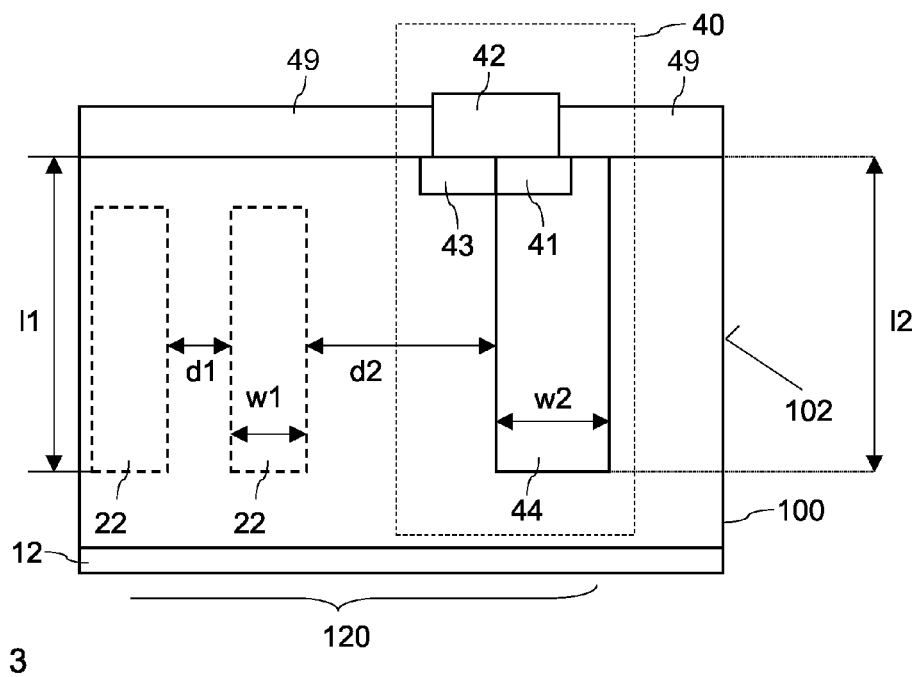
FIG. 3 illustrates a minority charge carrier converter according to a further embodiment.

In the semiconductor device of FIG. 2, the first and second trap regions 41, 44 are located between the inner region 110 (not illustrated in FIG. 2) and the contact region 43. According to a further embodiment that is illustrated in FIG. 3, the contact region 43 is located between the inner region 110 (not illustrated in FIG. 3) and the first and second trap regions 41, 44. In this embodiment, the second trap region 44 may extend to the edge surface 102 of the semiconductor body 100. The contact region 43 and the region below the contact region 43 act as a lateral field-stop in this embodiment.

Figure 4:
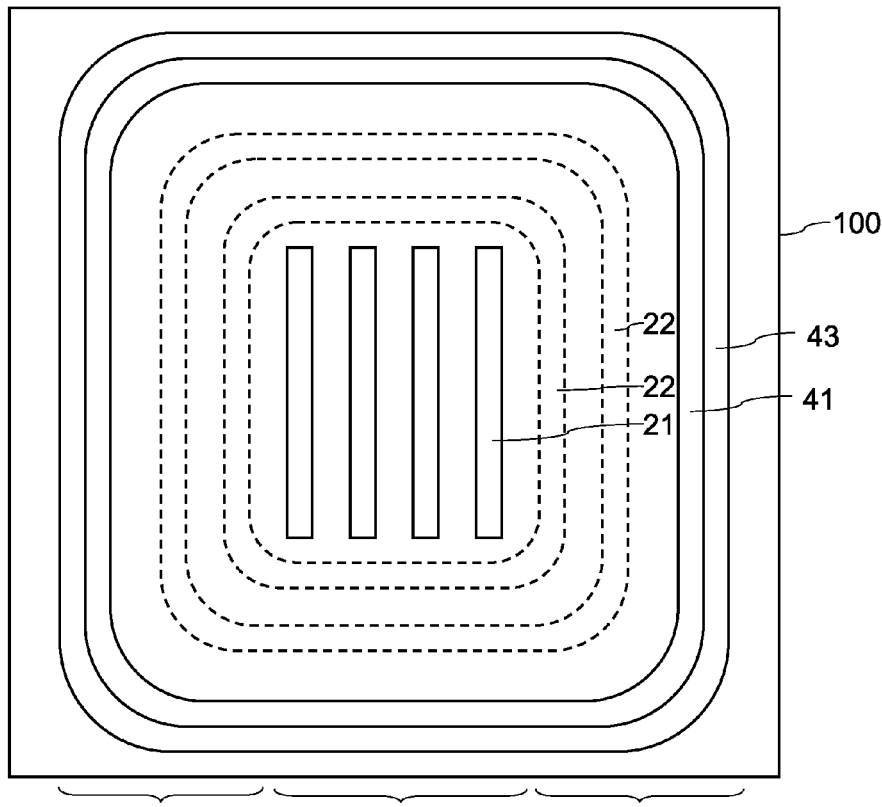
FIG. 4 illustrates a top view of a semiconductor device including a minority charge carrier converter with a horizontal topology according to one embodiment.

FIG. 4 schematically illustrates a top view on the first surface 101 of the semiconductor body 100. FIG. 4 schematically illustrates the position of several compensation regions 21 in the inner region 110 of the semiconductor device. These compensation regions 21 are elongated semiconductor regions in the present embodiment. The optional compensation regions 22 in the edge region 120 are ring-shaped and surround the inner region 110. Equivalently, the first trap region 41 and the contact region 43 are ring-shaped in the embodiment of FIG. 4 and surround the inner region 110 (and the optional compensation regions 22). The conductor (42 in FIGS. 1-3) on top of the first surface 101 of the semiconductor body 100 is not shown in FIG. 4.

Figure 5:
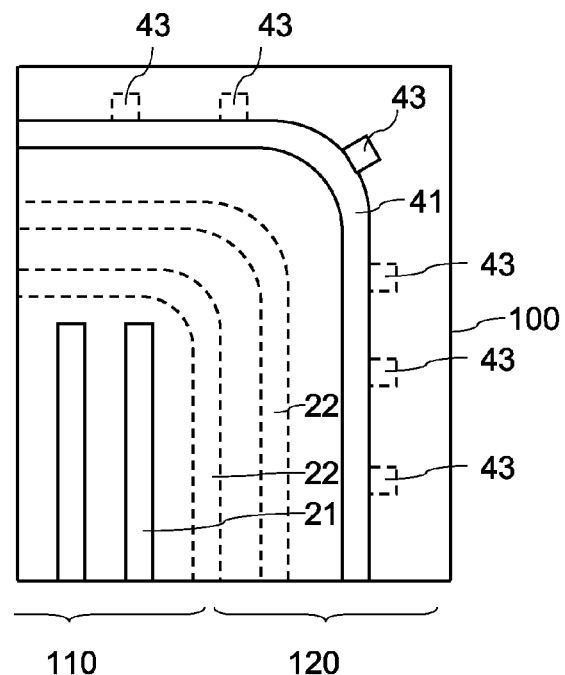
FIG. 5 illustrates a top view of a semiconductor device including a minority charge carrier converter with a horizontal topology according to one embodiment.

Referring to a further embodiment illustrated in FIG. 5, the first trap region 41 surrounds the inner region 110 (wherein in FIG. 5 only a section of the edge region 120 and the inner region 110 is illustrated), while there are several mutually spaced contact regions 43. According to one embodiment, the first trap region 41 forms a substantially rectangular ring (with rounded corners), wherein a contact region 43 is located in each corner of this rectangular ring. According to a further embodiment (illustrated in dashed lines in FIG. 5) contact regions 43 are also located along the first trap region 41 between corners of the first trap region 41.

Figure 6:
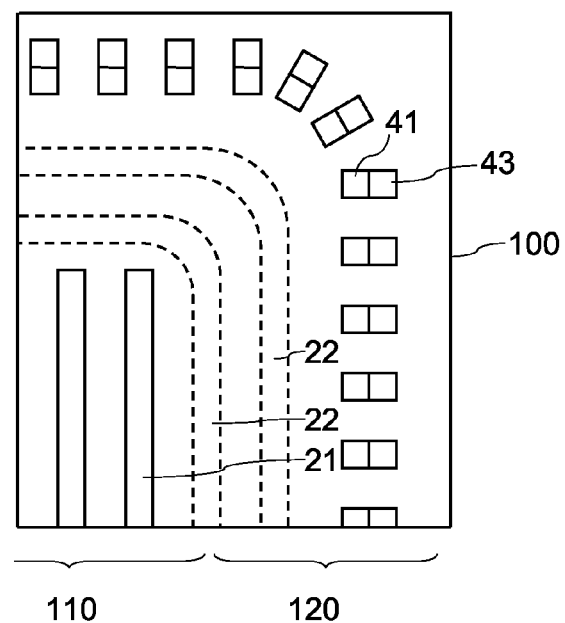
FIG. 6 illustrates a top view of a semiconductor device including a minority charge carrier converter with a horizontal topology according to one embodiment.

According to another embodiment illustrated in FIG. 6, there are a plurality of mutually spaced first trap regions 41 and contact regions 43 around the inner region 110 (wherein in FIG. 6 only a section of the edge region 120 and the inner region 110 is illustrated). In FIGS. 5 and 6 conductors electrically connecting the first trap regions 41 and the contact regions 43 are not illustrated.

Figure 7:
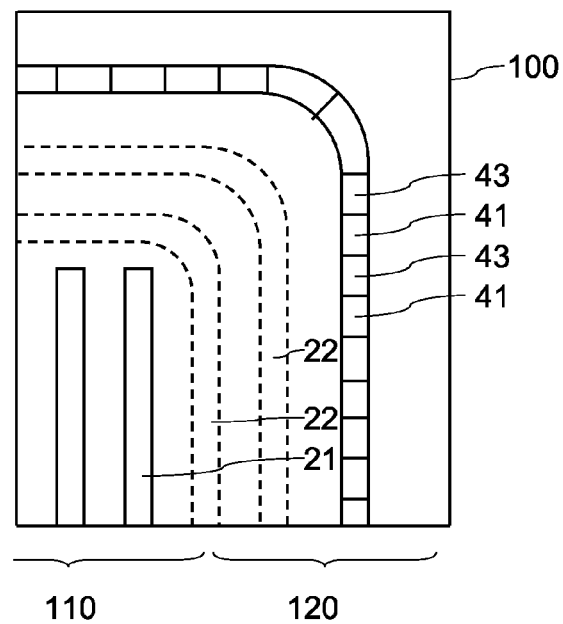
FIG. 7 illustrates a top view of a semiconductor device including a charge carrier converter with a horizontal topology according to one embodiment.

According to a further embodiment illustrated in FIG. 7, first trap regions 41 and contact regions 43 are arranged alternatingly around the inner region 110 and form a ring surrounding the inner region 110 (wherein in FIG. 7 only a section of the edge region 120 and the inner region 110 is illustrated). In this embodiment, each first trap region 41 adjoins two contact regions 43. However, this is only an example. According to a further embodiment (not illustrated) each first trap region 41 adjoins only one contact region 43.

Figure 8:
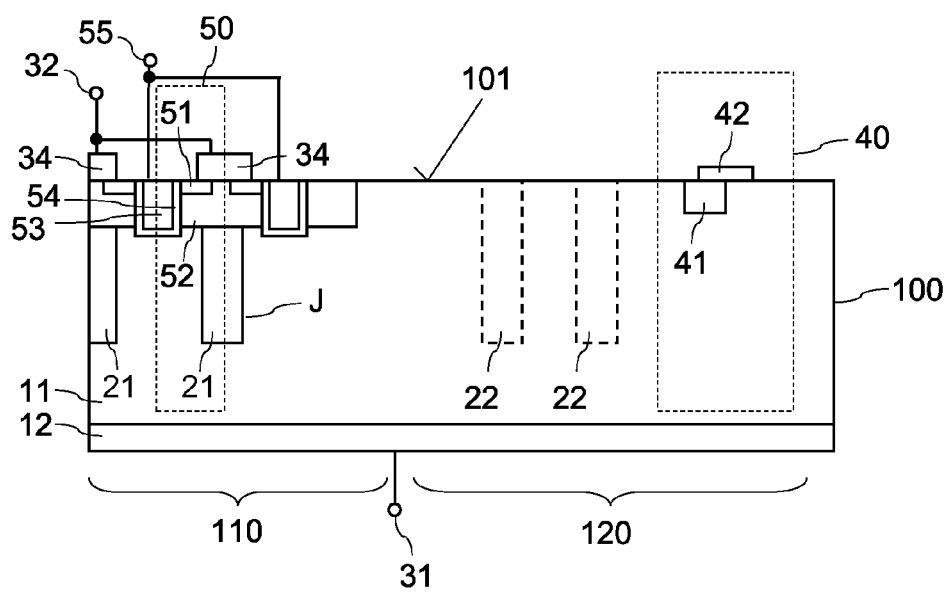
FIG. 8 illustrates a vertical cross sectional view of an MOS transistor including a minority charge carrier converter in an edge region of a semiconductor body.

FIG. 8 illustrates a vertical cross sectional view of a semiconductor device implemented as an MOS transistor. The basic topology of this semiconductor device corresponds to the basic topology explained with reference to FIG. 1. That is, the semiconductor device includes a semiconductor body 100 with an inner region 110 and an edge region 120, a drift region 11 in the inner region 110 and the edge region 120, a plurality of compensation regions 21 in the inner region 110 and a minority charge carrier trap 40 in the edge region 120. The minority charge carrier trap 40 is only schematically illustrated in FIG. 8. This minority charge carrier trap 40 can be implemented in accordance with one of the embodiments explained with reference to FIGS. 1 to 7 hereinbefore.

In the semiconductor device of FIG. 8, the third semiconductor region 12 forms a drain region of the MOS transistor. Further, the semiconductor device includes a plurality of transistor cells 50, wherein each transistor cell 50 includes a source region 51 of the first doping type, a body region 52 of the second doping type, a gate electrode 53 adjacent the body region 52 and dielectrically insulated from the body region 52 by a gate dielectric 54. The body region 52 separates the source region 51 from the drift region 11. The gate electrode 53 in a conventional manner serves to control a conducting channel in the body region 52 between the source region 51 and the drift region 11. Each of the transistor cells 50 further includes one compensation region 21 or a portion of one compensation region 21, wherein the compensation region is coupled to the body region 52. The source and body regions of the individual transistor cells 50 are electrically connected to the second terminal 32 through a source electrode 34. The individual compensation regions 21 are connected to the second terminals 32 via the body regions 52 and the source electrode 34. A passivation layer that may cover the first surface 101 in the edge region is not illustrated in FIG. 8. This passivation layer may include an insulation layer. According to one embodiment, the gate dielectric 54 and the gate electrode 53 are not only formed in the trenches of the individual transistor cells but are also formed on the first surface 101 in the edge region where they form the passivation layer.

The individual transistor cells 50 are connected in parallel by having their source and body regions 51, 52 connected to the second terminal 32 and by having their gate electrodes 53 connected to a common gate terminal 55. The individual transistor cells 50 share the drift region 11 and the drain region 12, wherein the drain region 12 is connected to the first terminal 31 (drain terminal) via a drain electrode (not shown) in the present embodiment.

The MOSFET can be implemented as an n-type or as a p-type MOSFET. In an n-type MOSFET, the source regions 51, the drift region 11 and the drain region 12 are n-doped, while the body regions 52 and the compensation regions 21 are p-doped. In a p-type MOSFET the doping types of the individual device regions are complementary to the doping types of the corresponding device regions in an n-type MOSFET.

The MOSFET of FIG. 8 can be operated like a conventional MOSFET. That is, the MOSFET can be operated in a forward biased state or in a reverse biased state. In the forward biased state the MOSFET can be switched on and off by suitably controlling the electrical potential (drive potential) at the gate electrodes 53 of the individual transistor cells 50. In the forward biased state of the MOSFET, the pn junction between the compensation regions 21 and the drift region 11 is reverse biased, so that the MOSFET is in an on-state when the gate electrodes 53 generate conducting channels in the body regions 52 between the source regions 51 and the drift region 11, and the MOSFET is in an off-state when the conducting channels between the source regions 51 and the drift region 11 are interrupted. In the off-state, a space charge region expands in the drift region 11 beginning at the pn junctions between the body regions 52 and the drift and compensation regions 11, 21, respectively. An n-type MOSFET is in the forward biased state when there is a positive voltage between the drain terminal 31 and the source terminal 32. In a p-type MOSFET, a negative voltage between the drain terminal and the source terminal 32 reverse biases the MOSFET.

The MOSFET is in the reverse bias state when the pn junctions between the body regions 52 and the drift region 11 and the compensation regions 21 and the drift region 11, respectively, are forward biased. In this operation state, the MOSFET acts like a diode, wherein in an n-type MOSFET the body regions 52 and the compensation regions 21 form an anode, and the drift and drain regions 11, 12 form a base and a cathode of this diode. This diode is also referred to as body diode of the MOSFET.

Figure 9:
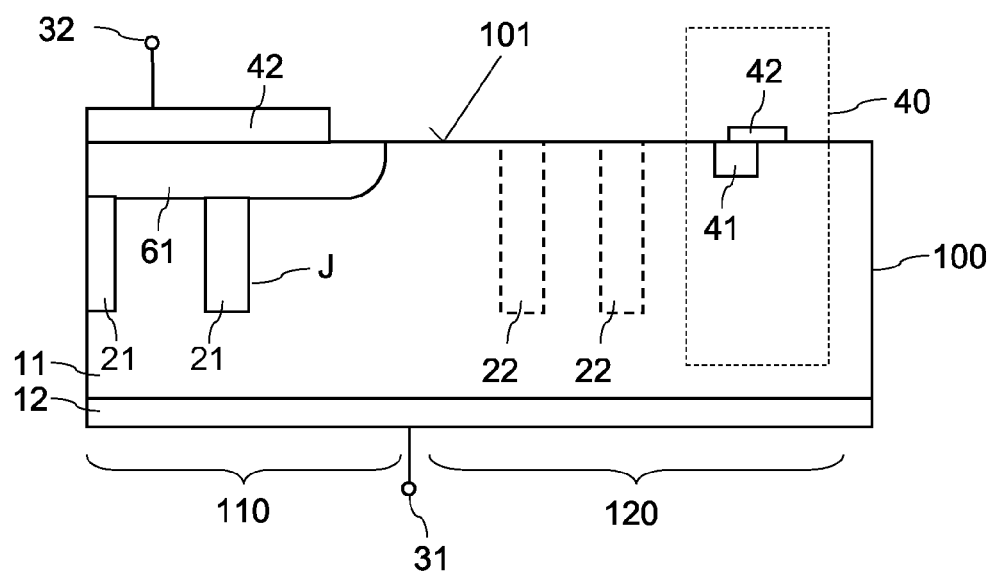
FIG. 9 illustrates a vertical cross sectional view of a diode including a minority charge carrier converter in an edge region of a semiconductor body.

FIG. 9 shows a vertical cross sectional view of a semiconductor device according to a further embodiment that includes the basic device topology explained with reference to FIG. 1. The semiconductor device of FIG. 9 is implemented as a diode in which the first device region 11 forms a base region, the third device region 12 forms a first emitter region and that additionally includes a second emitter region 61 connected to the second terminal 32. The compensation regions 21 are coupled to the second emitter region 61 and are coupled to the second terminal 32 via the second emitter region 61. The first emitter region 12 is connected to the first terminal 31.

The minority charge carrier trap 40 is only schematically illustrated in FIG. 9. This minority charge carrier trap can be implemented in accordance with one of the embodiment explained with reference to FIGS. 1 to 7 herein before.

The diode can be operated in a forward biased state and in a reverse biased state. In the forward biased state the pn junction between the second emitter region 61 and the drift region 11 and between the compensation regions 21 and the base region 11, respectively, is forward biased. In the reverse biased state, the pn junctions are reverse biased. In case the base region 11 and the first emitter region 12 are n-doped and the second emitter region 61 and the compensation regions 21 are p-doped, the diode is forward biased when the positive voltage is applied between the second terminal 32 and the first terminal 31, and is reverse biased when a positive voltage is applied between the first terminal 31 and the second terminal 32.

In the description hereinbefore, directional terminology, such as "top," "bottom," "front," "back," "leading," "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

It is to be understood that the features of the various embodiments described herein may be combined with each other, unless specifically noted otherwise.

What is claimed is:

1. A semiconductor device comprising:
a semiconductor body comprising an inner region and an edge region;
a first doped device region of a first doping type in the inner region and the edge region and coupled to a first terminal;
at least one second doped device region of a second doping type complementary to the first doping type, in the inner region, and coupled to a second terminal; and
a minority carrier converter structure in the edge region, the minority carrier converter structure comprising a first trap region of the second doping type adjoining the first doped device region, and a conductor electrically coupling the first trap region to the first doped device region, wherein the minority carrier converter structure further comprises a contact region of the first doping type and more highly doped than the first doped device region, wherein the contact region is connected to the conductor and adjoins the first doped device region.

2. The semiconductor device of claim 1, wherein the minority carrier converter structure further comprises a second trap region of the second doping type and more lowly doped than the first trap region, wherein the second trap region adjoins the first doped device region and the first trap region and extends deeper into the semiconductor body from a first surface than the first trap region.

3. The semiconductor device of claim 2, wherein the second trap region and the second doped device region have substantially the same doping concentration.

4. The semiconductor device of claim 3, wherein the conductor is connected to the second trap region.

5. The semiconductor device of claim 1, further comprising at least one further device region of the second doping in the edge region.

6. The semiconductor device of claim 5, wherein the at least one further device region is floating.

7. The semiconductor device of claim 1, wherein the first trap region surrounds the inner region in a horizontal plane of the semiconductor body.

8. The semiconductor device of claim 6, further comprising a contact region of the first doping type, wherein the contact region is more highly doped than the first doped device region, surrounds the inner region in a horizontal plane of the semiconductor body, is connected to the conductor, and adjoins the first doped device region.

9. The semiconductor device of claim 7, further comprising a plurality of contact regions of the first doping type and more highly doped than first doped device region, wherein the contact regions are mutually spaced in a horizontal plane of the semiconductor body, are connected to the conductor and adjoin the first doped device region.

10. The semiconductor device of claim 1, comprising a plurality of first trap regions that are mutually spaced in a horizontal plane of the semiconductor body.

11. The semiconductor device of claim 10, wherein the first trap regions define a ring around the inner region.

12. The semiconductor device of claim 10, further comprising a plurality of contact regions of the first doping type and more highly doped than first doped device region, wherein each of the plurality of contact regions is connected to the conductor and adjoins the first doped device region.

13. The semiconductor device of claim 11, wherein the plurality of first trap regions and the plurality of contact regions are arranged alternatingly and define a ring around the inner region.

14. The semiconductor device of claim 1,
wherein the first device region is a drift region, the second device region is a compensation region, the first terminal is a drain terminal, and the second terminal is a source terminal, and
wherein the semiconductor device further comprises:
a source region of the first doping type and a body region of the second doping type, each connected to the source terminal, wherein the body region is arranged between the source region and the drift region;
a gate electrode adjacent the body region and dielectrically insulated from the body region by a gate dielectric.

15. The semiconductor device of claim 14, further comprising a drain region of the first doping type, adjoining the drift region, and being more highly doped than the drift region.

16. The semiconductor device of claim 1,
wherein the first device region is a base region, the second device region is a compensation region, the first terminal is one of an anode and a cathode terminal, and the second terminal is the other one of an anode and a cathode terminal,
wherein the semiconductor device further comprises:
a first emitter region of the second doping type and connected to the first terminal; and
a second emitter region of the first doping type adjoining the base region, and more highly doped than the base region.

17. A semiconductor device comprising:
a semiconductor body comprising an inner region and an edge region;
a first doped device region of a first doping type in the inner region and the edge region and coupled to a first terminal;
at least one second doped device region of a second doping type complementary to the first doping type, in the inner region, and coupled to a second terminal; and
a minority carrier converter structure in the edge region, the minority carrier converter structure comprising a first trap region of the second doping type adjoining the first doped device region, and a conductor electrically coupling the first trap region to the first doped device region, wherein the minority carrier converter structure further comprises a second trap region of the second doping type and more lowly doped than the first trap region, wherein the second trap region adjoins the first doped device region and the first trap region and extends deeper into the semiconductor body from a first surface than the first trap region.

18. A semiconductor device comprising:
a semiconductor body comprising an inner region and an edge region;
a first doped device region of a first doping type in the inner region and the edge region and coupled to a first terminal;
at least one second doped device region of a second doping type complementary to the first doping type, in the inner region, and coupled to a second terminal; and
a minority carrier converter structure in the edge region, the minority carrier converter structure comprising a first trap region of the second doping type adjoining the first doped device region, and a conductor electrically coupling the first trap region to the first doped device region, wherein the first trap region surrounds the inner region in a horizontal plane of the semiconductor body.

19. A semiconductor device comprising:
a semiconductor body comprising an inner region and an edge region;
a first doped device region of a first doping type in the inner region and the edge region and coupled to a first terminal;
at least one second doped device region of a second doping type complementary to the first doping type, in the inner region, and coupled to a second terminal; and
a minority carrier converter structure in the edge region, the minority carrier converter structure comprising a first trap region of the second doping type adjoining the first doped device region, and a conductor electrically coupling the first trap region to the first doped device region; and
a plurality of first trap regions that are mutually spaced in a horizontal plane of the semiconductor body.

20. A semiconductor device comprising:
a semiconductor body comprising an inner region and an edge region;
a first doped device region of a first doping type in the inner region and the edge region and coupled to a first terminal;
at least one second doped device region of a second doping type complementary to the first doping type, in the inner region, and coupled to a second terminal; and
a minority carrier converter structure in the edge region, the minority carrier converter structure comprising a first trap region of the second doping type adjoining the first doped device region, and a conductor electrically coupling the first trap region to the first doped device region, wherein the first device region is a drift region, the second device region is a compensation region, the first terminal is a drain terminal, and the second terminal is a source terminal, and wherein the semiconductor device further comprises:
a source region of the first doping type and a body region of the second doping type, each connected to the source terminal, wherein the body region is arranged between the source region and the drift region; and
a gate electrode adjacent the body region and dielectrically insulated from the body region by a gate dielectric.

21. A semiconductor device comprising:
a semiconductor body comprising an inner region and an edge region;
a first doped device region of a first doping type in the inner region and the edge region and coupled to a first terminal;
at least one second doped device region of a second doping type complementary to the first doping type, in the inner region, and coupled to a second terminal; and
a minority carrier converter structure in the edge region, the minority carrier converter structure comprising a first trap region of the second doping type adjoining the first doped device region, and a conductor electrically coupling the first trap region to the first doped device region, wherein the first device region is a base region, the second device region is a compensation region, the first terminal is one of an anode and a cathode terminal, and the second terminal is the other one of an anode and a cathode terminal, wherein the semiconductor device further comprises:
a first emitter region of the second doping type and connected to the first terminal; and
a second emitter region of the first doping type adjoining the base region, and more highly doped than the base region.

\* \* \* \* \*